(12) United States Patent
Lin et al.

(10) Patent No.: US 12,131,917 B2
(45) Date of Patent: Oct. 29, 2024

(54) MANUFACTURING METHOD OF PACKAGE STRUCTURE

(71) Applicant: Innolux Corporation, Miao-Li County (TW)

(72) Inventors: Yi-Hung Lin, Miao-Li County (TW); Wen-Hsiang Liao, Miao-Li County (TW); Cheng-Chi Wang, Miao-Li County (TW); Yi-Chen Chou, Miao-Li County (TW); Fuh-Tsang Wu, Miao-Li County (TW); Ker-Yih Kao, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 408 days.

(21) Appl. No.: 17/523,919

(22) Filed: Nov. 11, 2021

(65) Prior Publication Data

US 2022/0181167 A1 Jun. 9, 2022

(30) Foreign Application Priority Data

Dec. 7, 2020 (CN) .......................... 202011415756.4

(51) Int. Cl.
*H01L 21/56* (2006.01)
*H01L 21/02* (2006.01)
*H01L 21/48* (2006.01)
*H01L 23/31* (2006.01)

(52) U.S. Cl.
CPC ........ *H01L 21/566* (2013.01); *H01L 21/0214* (2013.01); *H01L 21/02164* (2013.01); *H01L 21/4857* (2013.01); *H01L 23/3192* (2013.01); *H01L 2224/82005* (2013.01)

(58) Field of Classification Search
CPC . H01L 2224/95001; H01L 2224/82005; H01L 21/77; H01L 24/82
See application file for complete search history.

(56) References Cited

U.S. PATENT DOCUMENTS

| 2016/0254233 A1* | 9/2016 | Hu ............................ B32B 7/12 428/213 |
| 2018/0025955 A1* | 1/2018 | Rusli ................... H01L 23/5226 438/108 |
| 2021/0280521 A1* | 9/2021 | Chen ................. H01L 23/49894 |

FOREIGN PATENT DOCUMENTS

CN 107818953 A * 3/2018

OTHER PUBLICATIONS

Matweb, "Overview of Materials for Thermoplastic Polyimide, Unfilled", https://www.matweb.com/search/DataSheet.aspx?MatGUID=0ffae82745d04041b4f63a049230f646.*
Laminated Plastics, "Technical Data Sheet for FR-4", https://laminatedplastics.com/fr-4.pdf.*
Trost et al., "A New Approach to Evaluate the Elastic Modulus of Metallic Foils", Elsevier, Materials and Design 196, Sep. 14, 2020.*

* cited by examiner

*Primary Examiner* — Evan G Clinton
(74) *Attorney, Agent, or Firm* — JCIPRNET

(57) ABSTRACT

A manufacturing method of a package structure including the following steps is provided. A carrier is provided. An anti-warpage structure is formed on the carrier. And a redistribution layer is formed on the carrier. In the normal direction of the carrier, a warpage trend of the anti-warpage structure is opposite to a warpage trend of the redistribution layer.

19 Claims, 7 Drawing Sheets

MANUFACTURING METHOD OF PACKAGE STRUCTURE

CROSS-REFERENCE TO RELATED APPLICATION

This application claims the priority benefits of China application serial No. 202011415756.4, filed on Dec. 7, 2020. The entirety of the above-mentioned patent application is hereby incorporated by reference herein and made a part of this specification.

BACKGROUND

Technical Field

The disclosure relates to a manufacturing method of a package structure, particularly to a manufacturing method of a package structure capable of reducing warpage.

Description of Related Art

When the package structure is manufactured on a large substrate, due to factors such as the material or structure of the redistribution layer on the substrate, the entire substrate is prone to warping, which affects the production yield. Therefore, it is still necessary to improve its production methods to increase the production yield.

SUMMARY

The present disclosure provides a manufacturing method of a package structure capable of reducing warpage.

According to the embodiment of the present disclosure, the manufacturing method of the package structure includes the following steps: providing a carrier; forming an anti-warpage structure on the carrier; forming a redistribution layer on the carrier, where in the normal direction of the carrier, the warpage trend of the anti-warpage structure is opposite to the warpage trend of the redistribution layer.

BRIEF DESCRIPTION OF THE DRAWINGS

The accompanying drawings are included for further understanding of the present disclosure, and the accompanying drawings are incorporated into this specification and constitute a part of this specification. The drawings illustrate the embodiments of the present disclosure, and together with the description are used to explain the principles of the present disclosure.

DESCRIPTION OF THE EMBODIMENTS

Figure 1A:
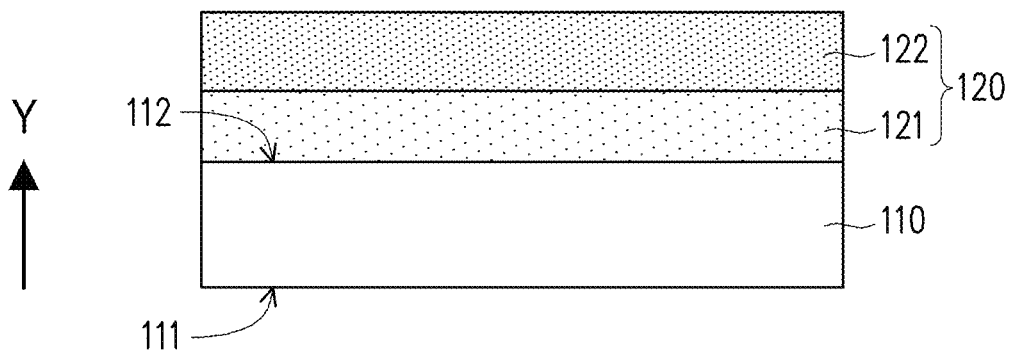
FIG. 1A to FIG. 1C are schematic cross-sectional views of a method of manufacturing a package structure according to an embodiment of the disclosure.

The present disclosure can be understood by referring to the following detailed description in conjunction with the accompanying drawings. It should be noted that, to facilitate the reader's understanding and the brevity of the drawings, the drawings in this disclosure only depict a part of an electronic device, and the specific elements in the drawings are not drawn according to actual scale. In addition, the number and size of each element in the drawings are only for schematic purposes and are not used to limit the scope of the disclosure.

In the following description and claims, the words "having" and "including" are open-ended words, so they should be interpreted as meaning "including but not limited to."

When an element or a film layer is referred to as being "on" or "connected" to another element or film layer, it may be directly on or directly connected to the other element or film layer. Or, there may be an element or film layer intervening between the two (in the case of indirect contact). Conversely, when an element is referred to as being "directly" on or "directly connected" to another element or film layer, there is no element or film layer intervening between the two.

Although the terms "first," "second," "third," and the likes can be used to describe various constituent elements, the constituent elements are not limited to these terms. This term is only used to distinguish a single constituent element from other constituent elements in the specification. The same terms may not be used in the claims, and the elements in the claims may be replaced with first, second, third and the likes according to the order declared by the elements in the claims. Therefore, in the following description, the first constituent element may be the second constituent element in the claims.

In this disclosure, the length and width may be measured by using an optical microscope, and the thickness may be measured by a cross-sectional image in an electron microscope, but it is not limited to this. In addition, there may be a certain error in any two values or directions used for comparison.

Hereinafter, the package structure in the electronic device is adapted to illustrate the content of the disclosure, but the disclosure is not limited thereto.

The following embodiments can be substituted, reorganized, and mixed to create other embodiments without departing from the spirit of the present disclosure. The features between the embodiments can be mixed and matched arbitrarily if they do not violate or conflict the spirit of the disclosure.

Reference is now made in detail to the exemplary embodiments of the present disclosure, and examples of the exemplary embodiments are illustrated in the accompanying drawings. Whenever possible, the same reference symbols are used in the drawings and the description to indicate the same or similar parts.

Figure 1B:
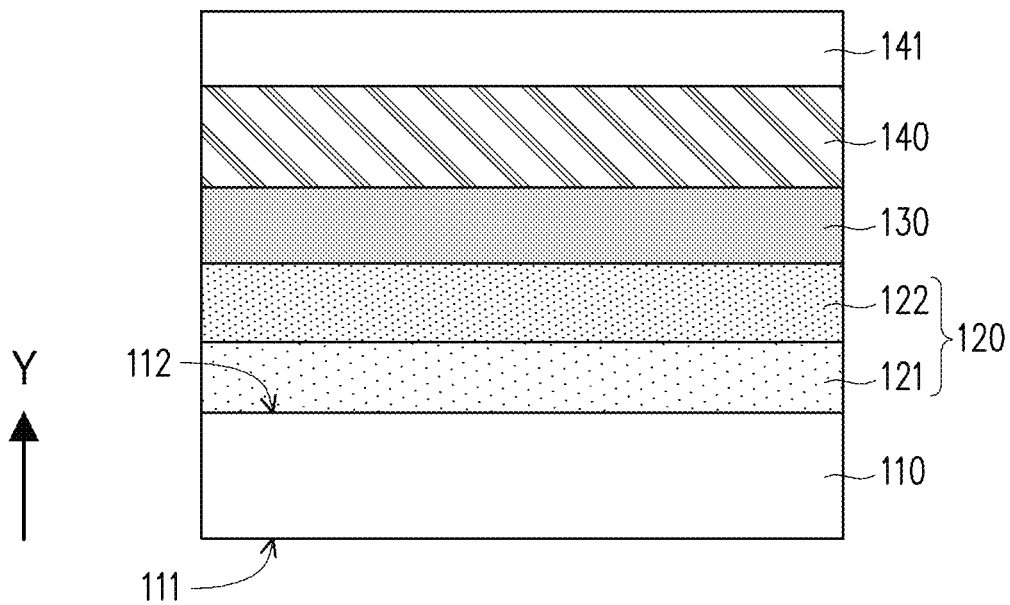
Figure 1C:
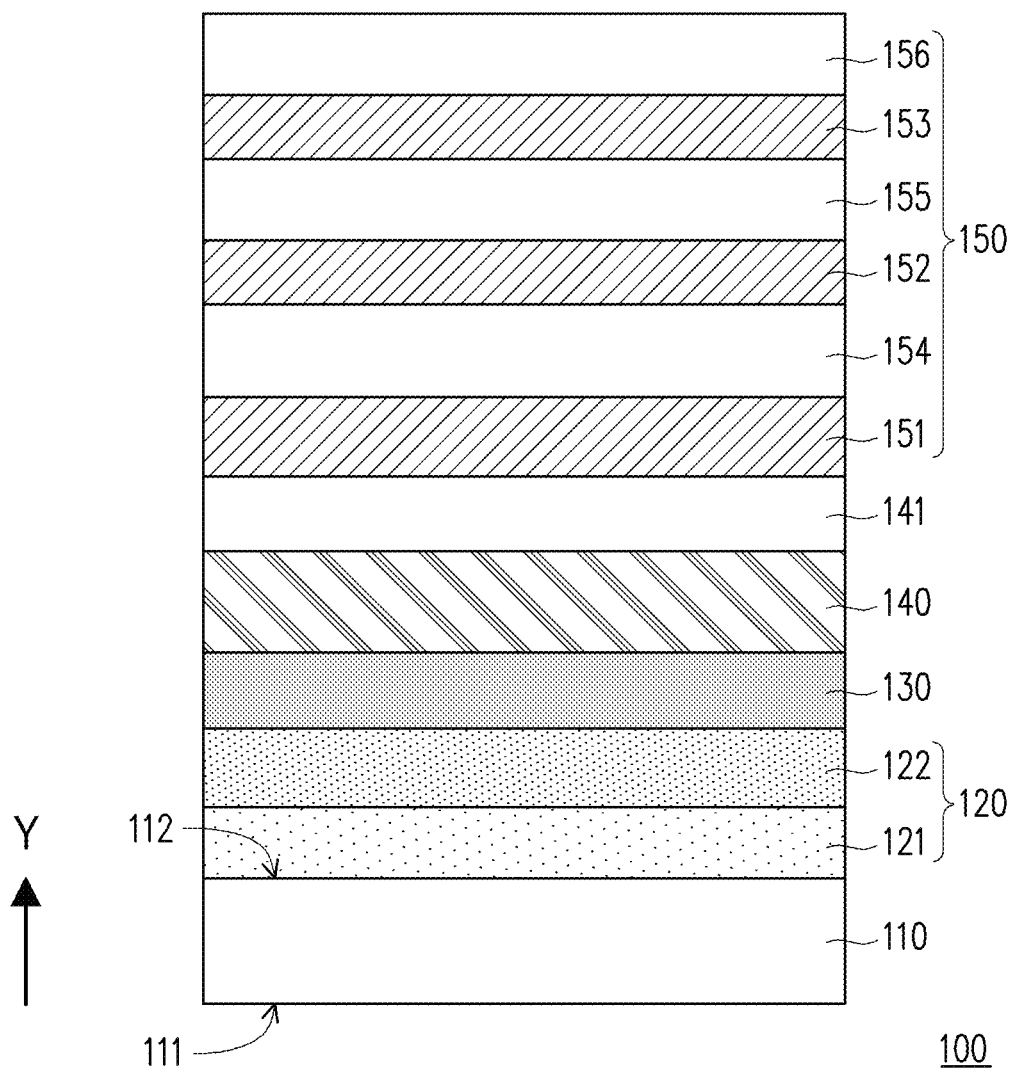

FIG. 1A to FIG. 1C are schematic cross-sectional views of a method of manufacturing a package structure according to an embodiment of the disclosure. In the manufacturing method of a package structure 100 of this embodiment, the following steps may be included.

First, in FIG. 1A, step 1 is performed: providing a carrier 110 and forming an anti-warpage structure 120 on the carrier 110. The carrier 110 has a first surface 111 and a second surface 112, and the first surface 111 and the second surface 112 are on opposite sides. The shape of the carrier 110 may be, for example, a rectangle or a square, and the length of at least one side thereof may be, for example, greater than or equal to 300 mm, but it is not limited thereto. In some embodiments, the size of a side of the carrier 110 may also be, for example, greater than or equal to 300 mm and less than or equal to 750 mm (300 mm ≤ size ≤ 750 mm). In this embodiment, the thickness of the carrier 110 may be, for example, 1400 μm, but it is not limited thereto. The thickness of the carrier 110 is, for example, the maximum thickness of the carrier 110 measured along a normal direction Y of the carrier 110. Young's modulus of the carrier 110 may be, for example, 5×109 Pa to 10×109 Pa (GPa) (5 GPa≤Young's modulus≤10 GPa), and the coefficient of thermal expansion (CTE) is, for example, 4 ppm/° C. to 10 ppm/° C. (4 ppm/° C.≤coefficient of thermal expansion≤10 ppm/° C.), but it is not limited to this. In addition, in this embodiment, the carrier 110 may include a rigid substrate, a flexible substrate, or a combination of the foregoing. For example, the material of the carrier 110 includes glass, quartz, sapphire, ceramics, polycarbonate (PC), polyimide (PI), polyethylene terephthalate (PET), other suitable substrate materials, or a combination of the foregoing, but it is not limited thereto. In some embodiments, the carrier 110 may include a wafer. It should be noted that the package structure may be formed by a RDL-first manufacturing method or a chip-first manufacturing method. In the RDL-first manufacturing method, the redistribution layer is formed before the chip molding process. In the chip-first manufacturing method, the chip molding process is performed before the formation of the redistribution layer. The RDL-first manufacturing method is exemplarily used in the present disclosure. The carrier is used to carry a redistribution layer which will be described in the following paragraphs. In the chip-first process, a chip molding process is performed to make a carrier including at least one chip and a molding material, and then the redistribution layer is formed on the carrier.

In this embodiment, the steps of forming the anti-warpage structure 120 on the carrier 110 include: first, a first anti-warpage layer 121 is formed on the second surface 112 of the carrier 110, and then a second anti-warpage layer 122 is formed on the first anti-warpage layer 121. In other words, the anti-warpage structure 120 may include the first anti-warpage layer 121 and the second anti-warpage layer 122, and the second anti-warpage layer 122 and the carrier 110 are respectively on opposite sides of the first anti-warpage layer 121. In this embodiment, the first anti-warpage layer 121 may directly contact the carrier 110, but it is not limited to this. The thickness of the first anti-warpage layer 121 is, for example, 0.5 μm to 1 μm (0.5 μm≤thickness≤1 μm), and the thickness of the second anti-warpage layer 122 is, for example, 0.5 μm to 1 μm (0.5 μm≤thickness≤1 μm), but it is not limited thereto. And the thickness of the first anti-warpage layer 121 is, for example, the maximum thickness of the first anti-warpage layer 121 measured along the normal direction Y of the carrier 110, whereas the thickness of the second anti-warpage layer 122 may be, for example, the maximum thickness of the second anti-warpage layer 122 measured along the normal direction Y of the carrier 110.

In this embodiment, Young's modulus of the first anti-warpage layer 121 is, for example, 70 GPa to 100 GPa (70 GPa≤Young's modulus≤100 GPa), and Young's modulus of the second anti-warpage layer 122 is, for example, 80 GPa to 120 GPa (80 GPa≤Young's modulus≤120 GPa), but it is not limited thereto. The coefficient of thermal expansion of the first anti-warpage layer 121 is, for example, 5 ppm/° C. to 10 ppm/° C. (5 ppm/° C.≤coefficient of thermal expansion≤10 ppm/° C.), and the coefficient of thermal expansion of the second anti-warpage layer 122 is, for example, 5 ppm/° C. to 10 ppm/° C. (5 ppm/° C.≤coefficient of thermal expansion≤10 ppm/° C.), but it is not limited thereto. In addition, in this embodiment, the material of the first anti-warpage layer 121 includes silicon oxide ($SiO_x$), and the material of the second anti-warpage layer 122 includes silicon nitride ($SiN_x$) or silicon oxynitride ($SiNO_x$), but it is not limited thereto. For example, when the material of the carrier 110 is glass and the material of the first anti-warpage layer 121 is silicon oxide, since the material of the carrier 110 and the material of the first anti-warpage layer 121 both contain silicon and oxygen, the adhesion between the carrier 110 and the first anti-warpage layer 121 is better.

Then, in FIG. 1B, step 2 is performed: after forming the anti-warpage structure 120 on the carrier 110, a release layer 130 is formed on the anti-warpage structure 120, and at least one metal layer 140 and at least one dielectric layer 141 are formed on the release layer 130. Specifically, the release layer 130 is formed on the second anti-warpage layer 122 of the anti-warpage structure 120, so that the release layer 130 and the carrier 110 are respectively located on opposite sides of the anti-warpage structure 120. In this embodiment, the release layer 130 may directly contact the second anti-warpage layer 122 of the anti-warpage structure 120, but it is not limited thereto. The thickness of the release layer 130 may be, for example, 0.2 μm to 0.6 μm (0.2 μm≤thickness≤0.6 μm), but it is not limited thereto. The thickness of the release layer 130 may be, for example, the maximum thickness of the release layer 130 measured along the normal direction Y of the carrier 110. The material of the release layer 130 is, for example, a polymer-based material, but it is not limited thereto. For example, the material of the release layer 130 is an epoxy-resin-based heat-release material that loses its adhesive properties when heated, such as a light-to-heat-conversion (LTHC) release coating; in some embodiments, the material of the release layer 130 may also be an ultraviolet glue that loses its adhesive properties when exposed to ultraviolet light, such as polyimide (PI), polyurethane, etc., but it is not limited thereto. Therefore, when the material of the second anti-warpage layer 122 is silicon nitride or silicon oxynitride, since the material of the release layer 130 and the material of the second anti-warpage layer 122 both contain nitrogen, the adhesion between the release layer 130 and the second anti-warpage layer 122 is better.

In some embodiments of the present disclosure, the release layer 130 may be removed together with the carrier 110 and the anti-warpage structure 120 in the subsequent step. The method for removing the release layer 130 may be, for example, using laser light with a wavelength of 308 nm or 351 nm to irradiate from the carrier 110 toward the release layer 130, so that the laser light penetrates the carrier 110 and the anti-warpage structure 12 and irradiates the release layer 130, such that the release layer 130 may be peeled off easily, but the method of removing the release layer 130 in the present disclosure is not limited to this. In this embodiment, the transmittance of the anti-warpage structure 120 under laser light with a wavelength of 308 nm or 351 nm is, for example, greater than or equal to 82% and less than or equal to 92% (82%≤transmittance≤92%), but it is not limited to this. It should be noted that in some embodiments, the removal of the release layer 130 and the carrier 110 is not necessary. That is, according to some embodiments, the release layer 130 and the carrier 110 are remained as a part of the package. In some other embodiments, the release layer 130 and the carrier 110 are removed and are not included in the package structure.

Next, after forming the release layer 130 on the anti-warpage structure 120, the metal layer 140 is first formed on the release layer 130, and then the dielectric layer 141 is formed on the metal layer 140, so that the dielectric layer 141 and the release layer 130 are respectively on opposite sides of the metal layer 140. In this embodiment, the thickness of the metal layer 140 is, for example, 2 μm to 6

μm (2 μm≤thickness≤6 μm), but it is not limited thereto. The thickness of the metal layer 140 may be, for example, the maximum thickness of the metal layer 140 measured along the normal direction Y of the carrier 110. The material of the metal layer 140 is, for example, titanium, copper, aluminum, molybdenum, silver, other suitable materials, or a combination of the foregoing, but it is not limited thereto. Note that in the present disclosure, the metal layer 140 may be a patterned circuit layer with bonding pads and/or wires, but it is not limited thereto.

In addition, in this embodiment, the thickness of the dielectric layer 141 is, for example, 4 μm to 20 μm (4 μm≤thickness≤20 μm), but it is not limited thereto. The thickness of the dielectric layer 141 may be, for example, the maximum thickness of the dielectric layer 141 measured along the normal direction Y of the carrier 110. Young's modulus of the dielectric layer 141 may be, for example, 1 GPa to 5 GPa (1 GPa≤Young's modulus≤5 GPa), but it is not limited thereto. The coefficient of thermal expansion of the dielectric layer 141 may be, for example, 20 ppm/° C. to 80 ppm/° C. (20 ppm/° C.≤coefficient of thermal expansion≤80 ppm/° C.), but it is not limited thereto. The material of the dielectric layer 141 is, for example, an organic material (such as polyimide), an inorganic material, or a combination of the foregoing, but it is not limited thereto.

Then, in FIG. 1C, step 3 is performed: forming a redistribution layer 150 above the second surface 112 of the carrier 110, so that the anti-warpage structure 120 is located between the redistribution layer 150 and the carrier 110, and the release layer 130 is also located between the redistribution layer 150 and the carrier 110. Specifically, the redistribution layer 150 may include circuit layers 151, 152, and 153 and dielectric layers 154, 155, and 156. And the circuit layer 151, the dielectric layer 154, the circuit layer 152, the dielectric layer 155, the circuit layer 153, and the dielectric layer 156 are sequentially formed on the dielectric layer 141.

In this embodiment, the thickness of the circuit layers 151, 152, and 153 is, for example, 2 μm to 6 μm (2 μm≤thickness≤6 μm), but it is not limited thereto. The thickness of the circuit layers 151, 152, and 153 is, for example, the maximum thickness of the circuit layers 151, 152, and 153 measured along the normal direction Y of the carrier 110. The material of the circuit layers 151, 152, and 153 may be, for example, titanium, copper, aluminum, molybdenum, silver, other suitable materials, or a combination of the foregoing, but it is not limited thereto.

In addition, in this embodiment, the thickness of the dielectric layers 154, 155, 156 is, for example, 4 μm to 20 μm (4 μm≤thickness≤20 μm), but it is not limited thereto. The thickness of the dielectric layers 154, 155, 156 may be, for example, the maximum thickness of the dielectric layers 154, 155, 156 measured along the normal direction Y of the carrier 110. Young's modulus of the dielectric layers 154, 155, 156 may be, for example, 1 GPa to 5 GPa (1 GPa≤Young's modulus≤5 GPa), but it is not limited thereto. The coefficient of thermal expansion of the dielectric layers 154, 155, 156 may be, for example, 20 ppm/° C. to 80 ppm/° C. (20 ppm/° C.≤coefficient of thermal expansion≤80 ppm/° C.), but it is not limited to this. The material of the dielectric layer 154, 155, 156 may be, for example, an organic material (for example, polyimide), an inorganic material, or a combination of the foregoing, but it is not limited thereto.

In addition, in this embodiment, the Young's modulus of the first anti-warpage layer 121 is, for example, greater than the Young's modulus of the dielectric layers 154, 155, and 156 in the redistribution layer 150. The value of the Young's modulus of the first anti-warpage layer 121 divided by the Young's modulus of the dielectric layers 154, 155, and 156 in the redistribution layer 150 may be, for example, 50 to 200 (50≤Young's modulus of the first anti-warpage layer/Young's modulus of the dielectric layer in the redistribution layer≤200), but it is not limited to this. Compared with the dielectric layers 154, 155, and 156 in the redistribution layer 150, the Young's modulus of the first anti-warpage layer 121 is larger, and thus the first anti-warpage layer 121 has greater rigidity (or hardness) and is less prone to deformation.

In this embodiment, although the redistributed wiring layer 150 includes three circuit layers (i.e., the circuit layers 151, 152, 153) and three dielectric layers (i.e., the dielectric layers 154, 155, 156), this disclosure does not limit the number of circuit layers and the number of dielectric layers in the redistribution layer. That is to say, in some embodiments, the redistribution layer may also include 1, 2, 3, or more circuit layers, and include 1, 2, 3, or more dielectric layers, but it is not limited to this. The package structure 100 of this embodiment has been substantially completed so far.

In this embodiment, in the normal direction Y of the carrier 110, the warpage trend of the anti-warpage structure 120 is opposite to the warpage trend of the redistribution layer 150. In this way, the anti-warpage structure 120 formed on the carrier 110 may be used to reduce the subsequent warpage caused by the formation of the redistribution layer 150. Note that, in the present disclosure, the term "warpage trend" refers to the overall warpage direction of a carrier 110 and the layered structure after a series of manufacturing processes are performed on the surface of the carrier 110. Specifically, when a center point of the lower surface of the carrier (the surface of the side of the carrier 110 that is not provided with the redistribution layer 150) is taken as the tangent point, a tangent plane tangent to the center point is set to be the reference plane. Then the distance between each endpoint of the carrier and the reference plane in the normal direction of the reference plane is measured. When the endpoint is higher than the plane, it is set as a positive value, and when it is lower than the plane, it is set as a negative value. If the sum of the distances of the endpoints is positive, it is defined that the layered structure has an upward warpage trend; conversely, when the sum of the distances of the endpoints is a negative value, it is defined that the layered structure has a downward warpage trend. For example, after the manufacture of the redistribution layer is completed on a square carrier (not shown) on which an anti-warpage structure is not provided, the warpage degree of the carrier caused by the redistribution layer may be greater than+1 mm (the symbol "+" represents that the warpage direction is upward in the Y direction in FIG. 1C) measured from the positions of the four endpoints of the square carrier (from the top view, when the length of one side of the carrier is 300 mm, the endpoint of the carrier is about 212 mm away from the center point of the carrier, and when the length of one side of the carrier is 750 mm, the endpoint of the carrier is about 530 mm away from the center point of the carrier). Note that in this disclosure, there may be more than one way to measure the degree of warpage. For example, one of the measurement methods is as follows: when the tangent plane at the center point of the carrier is adapted as the measurement plane, the distances between each endpoint of the four endpoints of the carrier and the measurement plane in the Y direction are measured, and it is found that at least one endpoint is warped upward, and the greatest distance between the four end points and the measurement plane in the Y direction is greater than 1 mm. Another measurement method is to dispose the carrier after the redistribution layer is manufactured on a firm and flat surface of a platform, and after it is balanced, to measure the distances between the four endpoints and the flat surface of the platform in the direction of the normal line on the flat surface by using an instrument or a ruler. It is found that at least one endpoint is upwardly warped, and the largest distance between the four end points and the measurement plane in the Y direction is greater than 1 mm. Due to the relationship between the carrier and the weight distribution inside the redistribution layer, in this measurement method, force may be applied to adjust the contact point between the carrier and the platform to the center point of the carrier.

In contrast, in the package structure 100 of the present embodiment, the warpage degree of the carrier 110 caused by the anti-warpage structure 120 formed first may be, for example, about −0.1 mm to −1 mm (the symbol "−" represents the direction of warpage that is opposite to the Y direction shown in FIG. 1C). In other words, the four endpoints of the carrier 110 relative to the center point are measured to have a distance about 0.1 mm to 1 mm warped downward. As the measurement method of the distance here may be similar to the measurement method mentioned above, the same is not repeated here. It can be seen from the foregoing disclosure that, in the package structure 100 of the present embodiment, the warpage trend (for example, warpage downward) of the anti-warpage structure 120 may be opposite to the warpage trend of the redistribution layer 150 (for example, warpage upward). Therefore, compared to the above-mentioned package structure (not shown) that is not provided with an anti-warpage structure, the package structure 100 of this embodiment utilizes the anti-warpage structure 120 formed on the carrier 110 first to reduce the subsequent warpage caused by the formation of the redistribution layer 150.

In addition, in this embodiment, an electronic device (not shown) may also be provided, and the electronic device may include the package structure 100 manufactured by the manufacturing method of the package structure 100 described above.

In short, in the manufacturing method of the package structure 100 of the disclosed embodiments, before forming the redistribution layer 150 on the carrier 110, the anti-warpage structure 120 is formed on the carrier 110 first. And since the warpage trend of the anti-warpage structure 120 is opposite to the warpage trend of the redistribution layer 150 in the normal direction Y of the carrier 110, compared to a package structure (not shown) that is not provided with an anti-warpage structure, the package structure 100 manufactured by the manufacturing method of the package structure 100 of this embodiment may utilize the anti-warpage structure 120 formed on the carrier 110 first to reduce the subsequent warpage caused by the formation of the redistribution layer 150.

Other embodiments are listed below for more description. Note here that the following embodiments adopt the element numbers and part of the content of the foregoing embodiments, wherein the same numbers represent the same or similar elements, and the description of the same technical content is omitted. For the description of the omitted parts, reference may be made to the foregoing embodiments, and the same description is not repeated in the following embodiments.

Figure 2A:
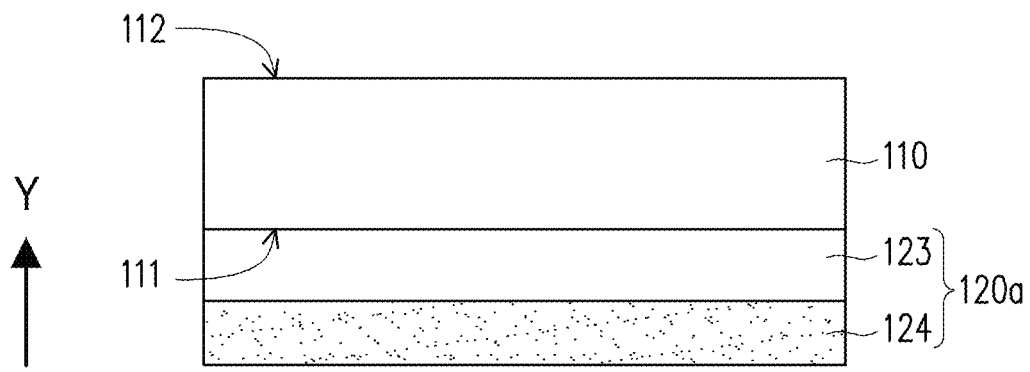
FIG. 2A to FIG. 2C are schematic cross-sectional views of a manufacturing method of a package structure according to another embodiment of the disclosure.
Figure 2B:
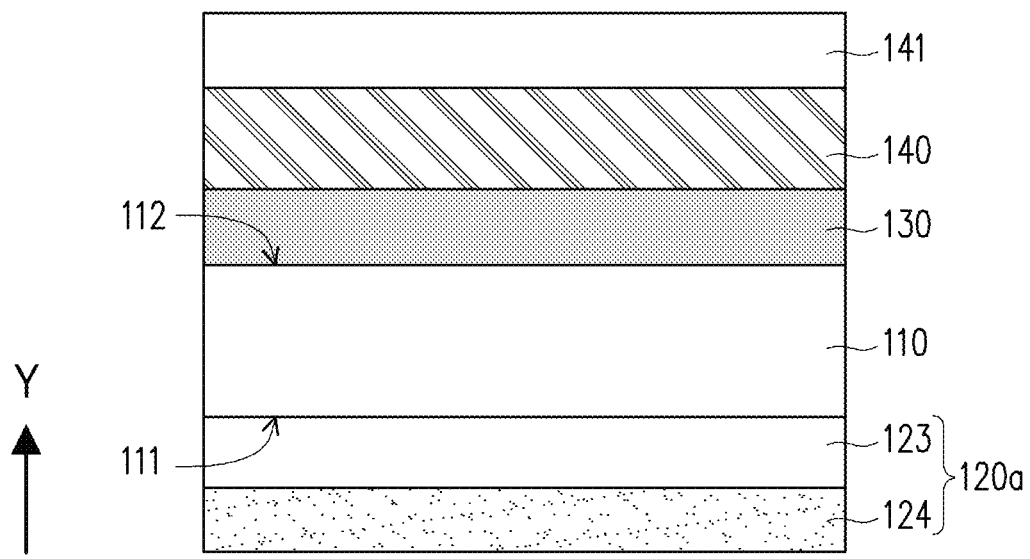
Figure 2C:
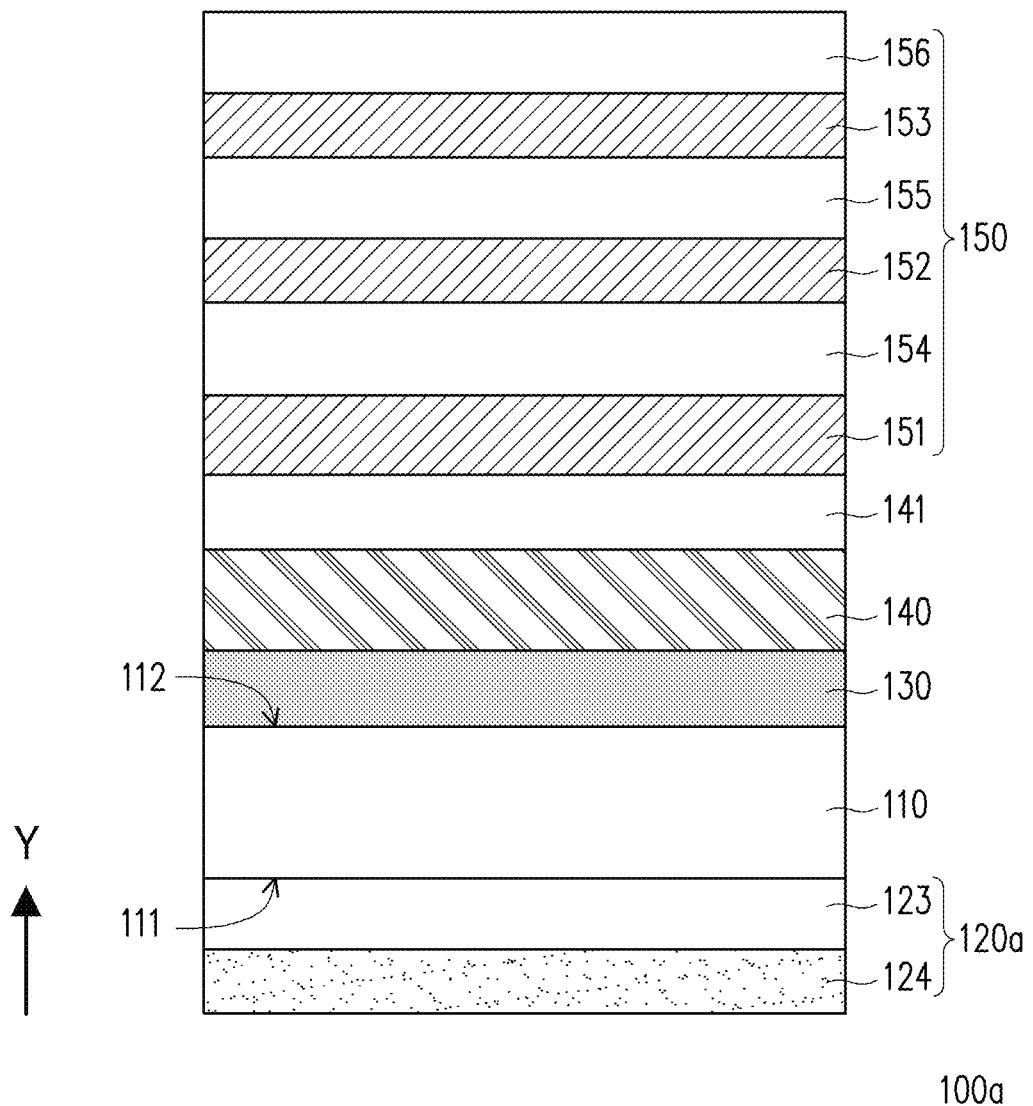

FIG. 2A to FIG. 2C are schematic cross-sectional views of a manufacturing method of a package structure according to another embodiment of the disclosure. Please refer to FIG. 1A to FIG. 1C and FIG. 2A to FIG. 2C at the same time. The embodiment shown in FIG. 2A to FIG. 2C is similar to the embodiment shown in FIG. 1A to FIG. 1C, and the same and similar components in the two embodiments are not repeated herein. The embodiment shown in FIG. 2A to FIG. 2C is different from the embodiment shown in FIG. 1A to FIG. 1C mainly in that: in the manufacturing method of a package structure 100a of this embodiment, an anti-warpage structure 120a replaces the anti-warpage structure 120 in FIG. 1A to FIG. 1C.

Specifically, in FIG. 2A, step 1 is performed: forming the anti-warpage structure 120a on a first surface 111 of a carrier 110. The anti-warpage structure 120a may include an adhesion layer 123 and a third anti-warpage layer 124, and the adhesion layer 123 is located between the carrier 110 and the third anti-warpage layer 124. In this embodiment, the thickness of the adhesive layer 123 is, for example, 1 μm to 25 μm (1 μm≤thickness≤25 μm), and the thickness of the third anti-warpage layer 124 may be, for example, 10 μm to 200 μm (10 μm≤thickness≤200 μm), but it is not limited thereto. In some embodiments, the thickness of the third anti-warpage layer 124 may also be, for example, 100 μm to 150 μm (100 μm≤thickness≤150 μm). And the thickness of the adhesive layer 123 may be, for example, the maximum thickness of the adhesive layer 123 measured along a normal direction Y of the carrier 110, and the thickness of the third anti-warpage layer 124 may be, for example, the maximum thickness of the third anti-warpage layer 124 measured along the normal direction Y of the carrier 110.

In addition, in this embodiment, Young's modulus of the third anti-warpage layer 124 is, for example, 5 GPa to 50 GPa (5 GPa≤Young's modulus≤50 GPa), but it is not limited thereto. The coefficient of thermal expansion of the third anti-warpage layer 124 may be, for example, 5 ppm/° C. to 10 ppm/° C. (5 ppm/° C.≤coefficient of thermal expansion≤10 ppm/° C.), but it is not limited thereto. The material of the third anti-warpage layer 124 may be an organic material, such as epoxy or polyimide, but it is not limited thereto. The transmittance of the anti-warpage structure 120a under laser light with a wavelength of 308 nm or 351 nm may be, for example, greater than or equal to 82% and less than or equal to 92% (82%≤transmittance≤92%), but it is not limited thereto.

Then, in FIG. 2B, step 2 is performed: after forming the anti-warpage structure 120a on the carrier 110, a release layer 130 is formed on a second surface 112 of the carrier 110, and a metal layer 140 and a dielectric layer 141 are formed on the release layer 130. The release layer 130 and the anti-warpage structure 120a are respectively on opposite sides of the carrier 110, and the release layer 130 contacts the carrier 110 directly.

Then, in FIG. 2C, step 3 is performed: after forming the anti-warpage structure 120a on the carrier 110, a redistribution layer 150 is formed above the second surface 112 of the carrier 110, so that the redistribution layer 150 and the anti-warpage structure 120a are respectively on opposite sides of the carrier 110. The package structure 100a of this embodiment has been substantially completed so far.

In addition, in this embodiment, the Young's modulus of the third anti-warpage layer 124 is, for example, greater than Young's modulus of dielectric layers 154, 155, and 156 in the redistribution layer 150. The value of the Young's modulus of the third anti-warpage layer 124 divided by the Young's modulus of the dielectric layers 154, 155, and 156 in the redistribution layer 150 may be, for example, 2 to 10 (2≤Young's modulus of the third anti-warpage layer/Young's modulus of the dielectric layer in the redistribution layer≤10), but it is not limited to this. That is to say, compared with the dielectric layers 154, 155, and 156 in the redistributed wiring layer 150, the Young's modulus of the third anti-warpage layer 124 is greater, and thus the third anti-warpage layer 124 has greater rigidity (or hardness) and is less prone to deformation.

In the manufacturing method of the package structure 100a of the disclosed embodiment, before forming the redistribution layer 150 on the carrier 110, the anti-warpage structure 120a is formed on the carrier 110 first. And since the warpage trend of the anti-warpage structure 120a is opposite to the warpage trend of the redistribution layer 150 in the normal direction Y of the carrier 110, compared to a package structure (not shown) that is not provided with an anti-warpage structure, the package structure 100a manufactured by the manufacturing method of the package structure 100a of this embodiment utilizes the anti-warpage structure 120a formed on the carrier 110 first to reduce the subsequent warpage caused by the formation of the redistribution layer 150.

FIG. 3A to FIG. 3D are schematic cross-sectional views of a manufacturing method of a package structure according to yet another embodiment of the disclosure. Please refer to FIG. 1A to FIG. 1C, FIG. 2A to FIG. 2C, and FIG. 3A to FIG. 3D at the same time. The embodiments in FIG. 1A to 1C and that in FIG. 2A to FIG. 2C are similar to the embodiment shown in FIG. 3A to FIG. 3D, so the description of the components same with and similar to the two embodiments is not repeated here. The main difference between the embodiment shown in FIG. 3A to FIG. 3D and the embodiments in FIG. 1A to FIG. 1C and FIG. 2A to FIG. 2C is: in the manufacturing method of a package structure 100b of this embodiment, the package structure 100b includes both an anti-warpage structure 120 and an anti-warpage structure 120a.

Specifically, step 1 is performed: a first surface 111 of the carrier 110 faces upward and a second surface 112 of the carrier 110 faces downward, so as to form the anti-warpage structure 120a on the first surface 111 of the carrier 110.

Figure 3A:
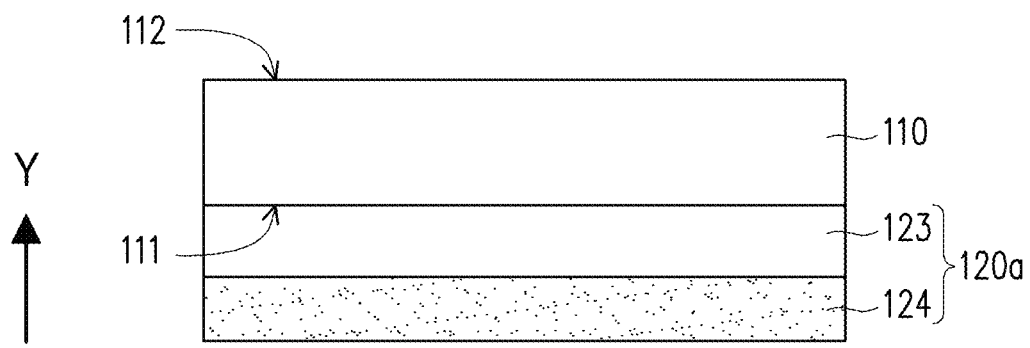
FIG. 3A to FIG. 3D are schematic cross-sectional views of a method of manufacturing a package structure according to yet another embodiment of the disclosure.
Figure 3B:
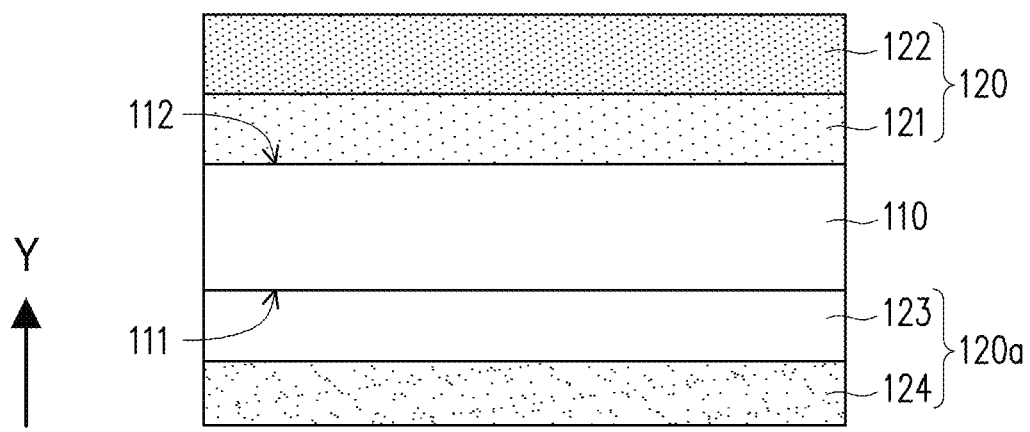

Then, in FIGS. 3A and 3B, step 2 is performed: after forming the anti-warpage structure 120a on the first surface 111 of the carrier 110, the carrier 110 is turned over so that the second surface 112 of the carrier 110 faces upward and the first surface 111 of the carrier 110 faces downward; then, the anti-warpage structure 120 is formed on the second surface 112 of the carrier 110, so that the anti-warpage structure 120 and the anti-warpage structure 120a are respectively on opposite sides of the carrier 110. In this embodiment, the value of the sum of the thickness of the first anti-warpage layer 121 and the thickness of the second anti-warpage layer 122 (that is, the thickness of the anti-warpage structure 120) divided by the thickness of the third anti-warpage layer 124 is 0.002 to 0.15 (0.002≤the sum of the thickness of the first anti-warpage layer and the second anti-warpage layer/the third anti-warpage layer≤0.15), but it is not limited to this.

Figure 3C:
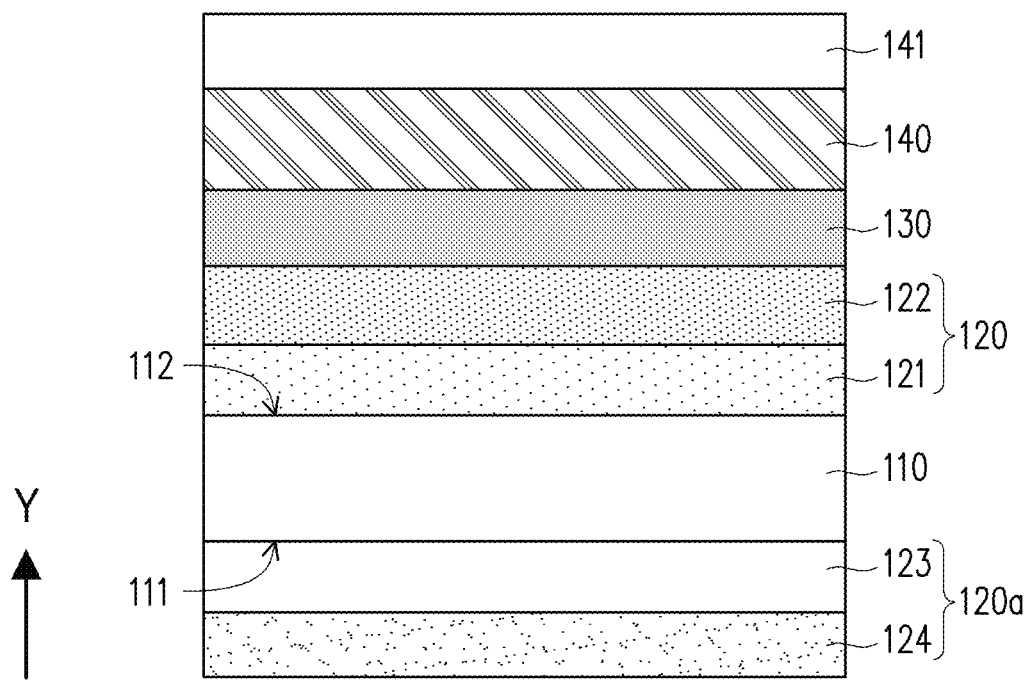

Then, in FIG. 3C, step 3 is performed: after forming the anti-warpage structure 120 on the second surface 112 of the carrier 110, a release layer 130 is formed above the second surface 112 of the carrier 110, and a metal layer 140 and a dielectric layer 141 are formed on the release layer 130. The release layer 130 and the carrier 110 are respectively on opposite sides of the anti-warpage structure 120.

Figure 3D:
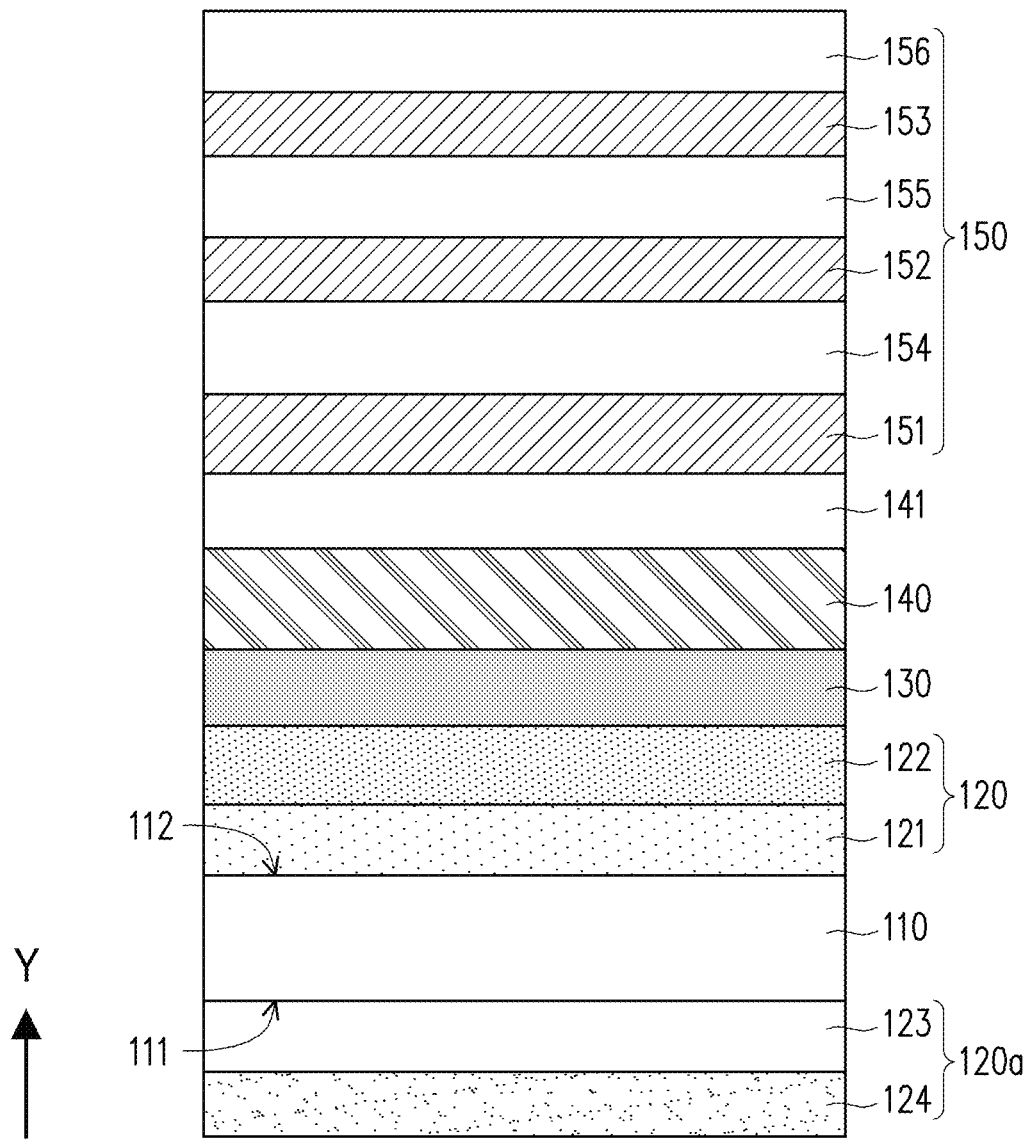

Then, in FIG. 3D, step 4 is performed: after forming the anti-warpage structure 120a on the first surface 111 of the carrier 110 and forming the anti-warpage structure 120 on the second surface 112 of the carrier 110, a redistribution layer 150 is formed above the second surface 112 of the carrier 110 so that the anti-warpage structure 120 is located between the redistribution layer 150 and the carrier 110. The package structure 100b of this embodiment has been substantially completed so far.

In the manufacturing method of the package structure 100b of this embodiment, the carrier 110 needs to be flipped over so that the anti-warpage structure 120 and the anti-warpage structure 120a are respectively formed on different surfaces of the carrier 110 (i.e., the first surface 111 and the second surface 112). However, the process of turning the carrier 110 over and the number of turnover may put the structure at the risk of scratches. Therefore, in this embodiment, the anti-warpage structure 120a is formed first, before the anti-warpage structure 120 is formed (that is, the second surface 112 first faces downward, and then the second surface 112 faces upward), which allows the release layer 130, the metal layer 140, the dielectric layer 141, and the redistribution layer 150 to be formed subsequent and directly on the anti-warpage structure 120 or the second surface 112 of the carrier 110, thereby reducing the number of turnover of the carrier 110 and the risk of scratches. In contrast, if the anti-warpage structure 120 is formed first and then the anti-warpage structure 120a is formed (that is, the second surface 112 first faces upward, and then the second surface 112 faces downward), it is necessary to turn the carrier 110 over again after forming the anti-warpage structure 120a, so that the second surface 112 of the carrier 110 may face upward to be provided subsequently with the release layer 130, the metal layer 140, the dielectric layer 141, and the redistributed wiring layer 150. Therefore, if the anti-warpage structure 120 is formed first and then the anti-warpage structure 120a is formed, the number of turnover of the carrier 110 and the risk of scratches increase.

In summary, in the manufacturing method of the package structure of the embodiment of the present disclosure, before forming the redistribution layer on the carrier, the anti-warpage structure is first formed on the carrier. Since the warpage trend of the anti-warpage structure is opposite to the warpage trend of the redistribution layer in the normal direction of the carrier, compared to a package structure that is not provided with an anti-warpage structure, the package structure manufactured by the manufacturing method of the present embodiment may utilize the anti-warpage structure first formed on the carrier to reduce the subsequent warpage caused by the formation of the redistribution layer.

Finally, it should be noted that the above embodiments are only used to illustrate the technical solutions of the present disclosure, but not to limit them; although the disclosure has been described in detail with reference to the foregoing embodiments, those of ordinary skill in the art should understand that they can still modify the technical solutions described in the foregoing embodiments, or replace some or all the technical features with their equivalence. These modifications or replacements do not cause the essence of the corresponding technical solutions to deviate from the scope of the technical solutions of the embodiments of the present disclosure.

What is claimed is:

1. A manufacturing method of a package structure, comprising:
   providing a carrier;
   forming an anti-warpage structure on the carrier; and
   forming a redistribution layer on the carrier, wherein in a normal direction of the carrier, a warpage trend of the anti-warpage structure is opposite to a warpage trend of the redistribution layer,
   wherein the anti-warpage structure comprises a first anti-warpage layer and a second anti-warpage layer, the first anti-warpage layer comprises silicon oxide, and the second anti-warpage layer comprises silicon nitride or silicon oxynitride.

2. The manufacturing method according to claim 1, wherein the anti-warpage structure is located between the redistribution layer and the carrier.

3. The manufacturing method according to claim 1, wherein the first anti-warpage layer of the anti-warpage structure contacts the carrier directly.

4. The manufacturing method according to claim 2, wherein a thickness of the first anti-warpage layer of the anti-warpage structure is 0.5 μm to 1 μm.

5. The manufacturing method according to claim 2, wherein Young's modulus of the first anti-warpage layer is greater than Young's modulus of a dielectric layer in the redistribution layer.

6. The manufacturing method according to claim 5, wherein a value of the Young's modulus of the first anti-warpage layer of the anti-warpage structure divided by the Young's modulus of the dielectric layer in the redistribution layer is 50 to 200.

7. The manufacturing method according to claim 5, wherein the Young's modulus of the first anti-warpage layer is 70 GPa to 100 Gpa.

8. The manufacturing method according to claim 7, wherein the anti-warpage structure comprises an adhesion layer and a third anti-warpage layer, and the adhesion layer is located between the carrier and the third anti-warpage layer.

9. The manufacturing method according to claim 8, wherein a thickness of the third anti-warpage layer is 10 μm to 200 μm.

10. The manufacturing method according to claim 8, wherein Young's modulus of the third anti-warpage layer is greater than the Young's modulus of the dielectric layer in the redistribution layer.

11. The manufacturing method according to claim 10, wherein a value of the Young's modulus of the third anti-warpage layer divided by the Young's modulus of the dielectric layer in the redistribution layer is 2 to 10.

12. The manufacturing method according to claim 10, wherein the Young's modulus of the third anti-warpage layer is 5 GPa to 50 Gpa.

13. The manufacturing method according to claim 1, further comprising:
forming a release layer, wherein the release layer is located between the redistribution layer and the carrier.

14. The manufacturing method according to claim 13, wherein the release layer is located on the anti-warpage structure and contacts the anti-warpage structure directly.

15. The manufacturing method according to claim 13, further comprising:
forming a metal layer on the release layer, wherein the metal layer is a patterned circuit layer.

16. The manufacturing method according to claim 13, wherein the release layer and the anti-warpage structure are respectively located on opposite sides of the carrier, and the release layer contacts the carrier directly.

17. The manufacturing method according to claim 1, wherein the redistribution layer and the anti-warpage structure are respectively located on opposite sides of the carrier.

18. The manufacturing method according to claim 1, wherein the anti-warpage structure comprises a first anti-warpage structure and a second anti-warpage structure, and forming the anti-warpage structure on the carrier comprises:
forming the first anti-warpage structure on a first surface of the carrier; and
forming the second anti-warpage structure on a second surface of the carrier, so that the second anti-warpage structure and the first anti-warpage structure are respectively located on opposite sides of the carrier, wherein the first surface and the second surface are opposite to each other.

19. The manufacturing method according to claim 1, wherein the carrier comprises at least one chip and a molding material.

* * * * *